US006979847B2

(12) United States Patent
Mitsuhashi

(10) Patent No.: US 6,979,847 B2
(45) Date of Patent: Dec. 27, 2005

(54) FERROELECTRIC ELEMENT AND METHOD FOR MANUFACTURING THE SAME

(75) Inventor: Toshiro Mitsuhashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 80 days.

(21) Appl. No.: 10/766,483

(22) Filed: Jan. 29, 2004

(65) Prior Publication Data

US 2005/0062086 A1 Mar. 24, 2005

(30) Foreign Application Priority Data

Sep. 22, 2003 (JP) .............................. 2003-329815

(51) Int. Cl.[7] .................. H01L 29/76; H01L 29/94; H01L 31/062; H01L 31/113; H01L 31/119

(52) U.S. Cl. ...................................... 257/295; 257/296

(58) Field of Search ................................ 257/295, 296, 257/300

(56) References Cited

U.S. PATENT DOCUMENTS

2002/0021544 A1 * 2/2002 Cho et al. .................... 361/200
2004/0183112 A1 * 9/2004 Okita ......................... 257/296

FOREIGN PATENT DOCUMENTS

JP 11-121704 4/1999
JP 2002-305288 10/2002

* cited by examiner

Primary Examiner—Ngân V. Ngô
(74) Attorney, Agent, or Firm—Volentine Francos & Whitt, PLLC

(57) ABSTRACT

In a ferroelectric element, the ferroelectric film is prevented from deteriorating and the interconnect film from lowering in reliability. A ferroelectric element comprises a first electrode, a ferroelectric film formed on the first electrode, a second electrode formed on the ferroelectric film, a first hydrogen blocking film formed directly on a surface of the second electrode, a first insulation film formed on the first hydrogen blocking film, a first opening formed in the first hydrogen blocking film exposing a part of the second electrode, a second opening formed in the first insulation film and having a greater diameter than the diameter of the first opening, and an interconnect film connected to the second electrode through the first and second openings.

9 Claims, 9 Drawing Sheets

FERROELECTRIC ELEMENT AND METHOD FOR MANUFACTURING THE SAME

BACKGROUND OF THE INVENTION

1. Field of the Invention

This invention relates to a ferroelectric element and method for manufacturing the same and, more particularly, to a ferroelectric element having a hydrogen blocking film formed directly on a surface of the upper electrode thereof and a method for manufacturing the same.

2. Description of Related Art

There is, as a ferroelectric element, a ferroelectric capacitor structured by a ferroelectric film, such as of PZT or SBT, sandwiched between the upper and lower electrodes of Pt or the like. The ferroelectric capacitor, for holding data in a non-volatile fashion by the utilization of a spontaneous polarization characteristic of the ferroelectric film, is utilized for a non-volatile semiconductor memory (FeRAM, Ferroelectric Random Access Memory).

The ferroelectric capacitor used for a semiconductor memory or the like has a structure described, for example, in Patent Documents 1 and 2. In the ferroelectric capacitor described in Patent Documents 1 and 2, a lower electrode, a ferroelectric film and an upper electrode are layered and patterned in the order, and then these are covered by a reaction preventing film (hydrogen blocking film) and an oxide film (interlayer insulation film) in that order. Then, a contact hole (opening) is formed in the hydrogen blocking film and oxide film, to expose the upper electrode. Through the opening, a metal interconnect layer is (interconnect film) connected to the upper electrode.

[Patent document 1] JP-A-2002-305288 (page 3, FIG. 1)
[Patent document 2] JP-A-11-121704 (pages 1–8, FIGS. 1–6)

In the ferroelectric capacitor described in Patent documents 1 and 2, the opening having a constant diameter is formed through the hydrogen blocking film and oxide film covering the lower electrode, ferroelectric film and upper electrode, thereby forming an interconnect film in the opening. However, because the hydrogen blocking film is removed at the opening, hydrogen possibly enters at the opening into the ferroelectric film through the upper electrode thereby deteriorating the ferroelectric film, resulting in a fear causing deterioration in the feroelectric film. Meanwhile, in order to prevent the intrusion of hydrogen, in case the opening portion is made smaller while maintaining the opening at the constant diameter, the opening has an increased aspect ratio. This worsens the coverage of the interconnect film connected to the upper electrode through the opening, which possibly causes a fear of lowered reliability of the interconnect film.

It is an object of the present invention to prevent, in a ferroelectric element, the ferroelectric film from deteriorating and the interconnect film from lowering in reliability.

SUMMARY OF THE INVENTION

A ferroelectric element according to the present invention comprises: a first electrode; a ferroelectric film formed on the first electrode; a second electrode formed on the ferroelectric film; a first hydrogen blocking film formed directly on a surface of the second electrode; a first insulation film formed on the first hydrogen blocking film; a first opening formed in the first hydrogen blocking film and exposing a part of the second electrode; a second opening in the first insulation film formed having a greater diameter than a diameter of the first opening; and an interconnect film connected to the second electrode through the first and second openings.

A method for manufacturing a ferroelectric element according to the invention comprises: a step of forming a first electrode, a ferroelectric film, and a second electrode, in that order; a step of forming a first hydrogen blocking film directly on a surface of the second electrode; a step of forming a first insulation film on the first hydrogen blocking film; a step of forming in the first hydrogen blocking film an opening exposing a part of the second electrode and first insulation film such that a diameter in the first hydrogen blocking film is smaller than a diameter in the first insulation film; and a step of forming an interconnect film connected to the second electrode through the opening.

The first insulation film may be structured by one or a plurality of films including a hydrogen and/or oxygen blocking film, a nitride film and an oxide film.

According to the ferroelectric element of the invention, the first opening in the first hydrogen blocking film exposing the second electrode has a diameter smaller than the diameter of the second opening in the first insulation film. Accordingly, by suppressing the area of the region in which the first hydrogen blocking film covering the second electrode is removed, hydrogen can be suppressed from entering at the first opening into the ferroelectric film through the second electrode, thereby improving the reliability of the ferroelectric film. Meanwhile, because the first hydrogen blocking film generally is formed smaller in thickness than the first insulation film, even in case the first opening is formed small in diameter, there is a less possibility of increasing the aspect ratio of the first opening. Furthermore, in the first insulation film greater in film thickness, because the second opening has an increased diameter to suppress the aspect ratio on the second opening from increasing, the interconnect film formed through the first and second openings is not worsened in coverage, thus preventing against lowering in interconnect-film reliability.

According to the method for manufacturing a ferroelectric element according to the invention, the opening is formed such that its diameter in the first hydrogen blocking film exposing the second electrode is smaller than that in the first insulation film. Accordingly, by suppressing the area of the first hydrogen blocking film covering the second electrode which is removed, hydrogen can be suppressed from entering at the first opening into the ferroelectric film through the second electrode, thereby improving the reliability of the ferroelectric film. Meanwhile, because the first hydrogen blocking film generally is formed smaller in thickness than the first insulation film, even in case the opening is formed small in diameter, there is a less possibility of increasing the aspect ratio of the first opening. Furthermore, in the first insulation film greater in film thickness, because the opening has an increased diameter to suppress the aspect ratio on the opening from increasing, the interconnect film formed through the opening is not worsened in coverage, thus preventing against lowering in interconnect-film reliability.

DESCRIPTION OF THE PREFERRED EMBODIMENTS (1) First Embodiment

FIGS. 1 to 12 are sectional views explaining a method for manufacturing a ferroelectric element according to a first embodiment of the present invention. Explanation herein is made on a ferroelectric element by exemplifying a ferroelectric capacitor to be applied to an FeRAM (Ferroelectric Random Access Memory) or the like.

[Structure]

Figure 12:
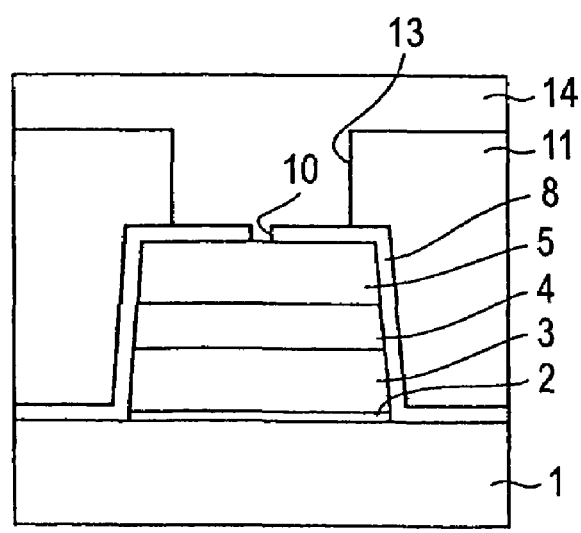
FIG. 12 is a sectional view explaining a method for manufacturing a ferroelectric element according to a first embodiment (12)
Figure 13:
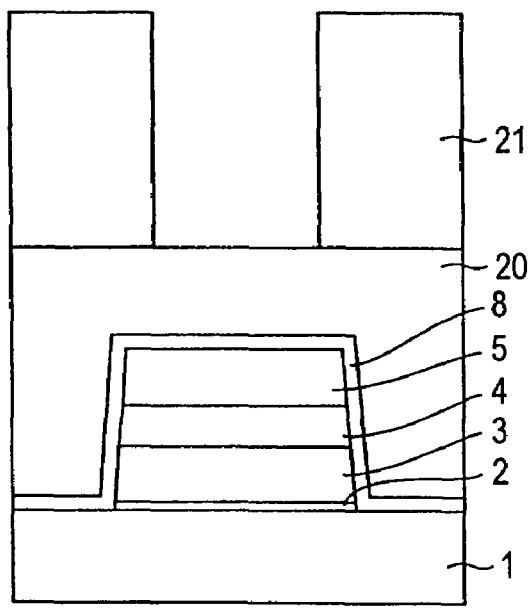
FIG. 13 is a sectional view explaining a method for manufacturing a ferroelectric element according to a second embodiment (13)

A ferroelectric capacitor of this embodiment has, as shown in FIG. 12, an oxide film 1 of $SiO_2$ on which is formed an adhesion film 2, a lower electrode 3 (first electrode), a ferroelectric film 4 and an upper electrode 5 (second electrode), in the order. A hydrogen blocking film 8 (first hydrogen blocking film) and interlayer insulation film 11 (first insulation film) is formed in a manner directly covering the adhesion film 2, the lower electrode 3, the ferroelectric film 4 and the upper electrode 5. Meanwhile, the hydrogen blocking film 8 is formed with an opening 10 (first opening) having a diameter of 0.2 micrometer, to expose part of the upper electrode 5. The interlayer film 11 is formed with an opening 13 (second opening) having a diameter of 0.6 micrometer greater than that of the opening 10. An aluminum interconnect film 14 (interconnect film) is formed connected to the upper electrode 5 through the openings 10 and 13. The opening 10 is formed nearly in a constant diameter of 0.2 micrometer with respect to the axial direction while the opening 13 is formed nearly in a constant diameter of 0.6 micrometer with respect to the axial direction.

[Manufacturing Method]

Now a method for manufacturing a ferroelectric capacitor of this embodiment is explained, with reference to FIGS. 1 to 12.

Figure 1:
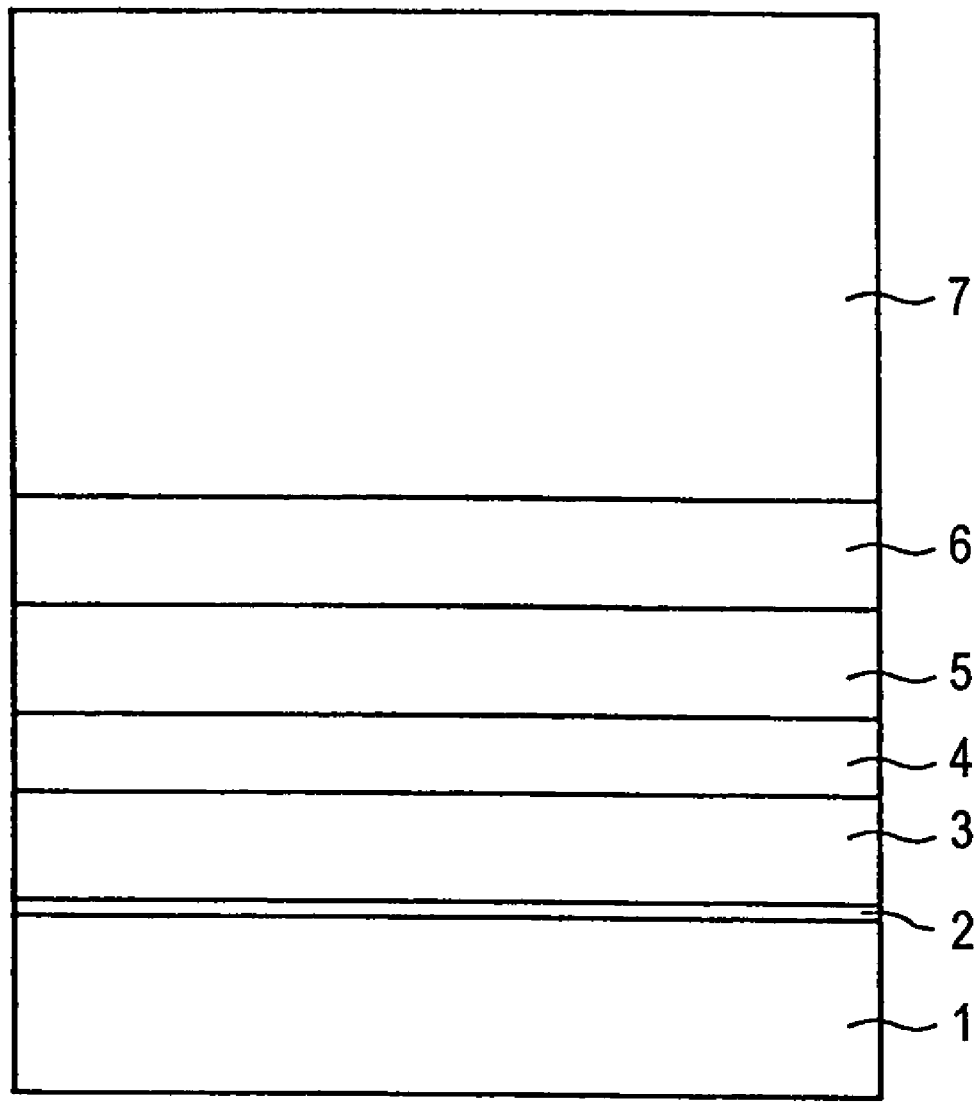
FIG. 1 is a sectional view explaining a method for manufacturing a ferroelectric element according to a first embodiment (1)
Figure 2:
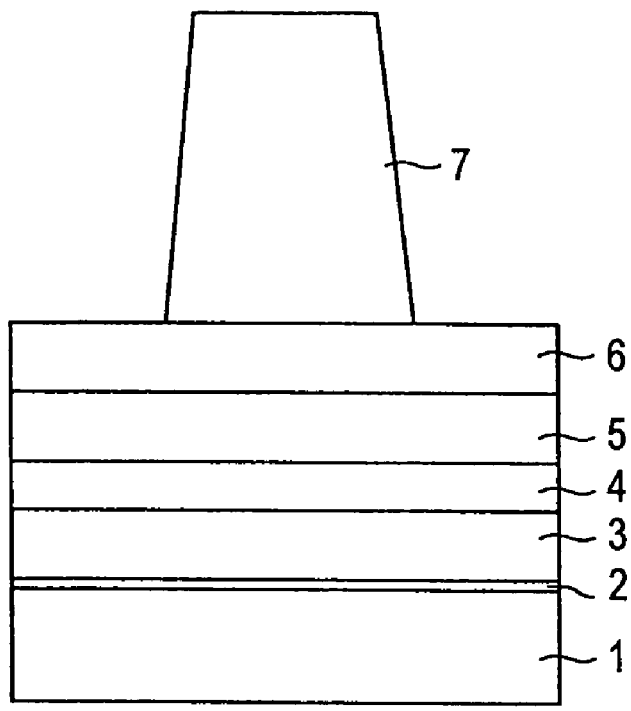
FIG. 2 is a sectional view explaining a method for manufacturing a ferroelectric element according to a first embodiment (2)

At first, on an $SiO_2$ oxide film 1 formed by a CVD (Chemical Vapor Deposition) process, formed are a TiN adhesion film 2 having a film thickness 60 nm, an Ir lower electrode 3 having a film thickness 150 nm, an SBT ($SrBi_2Ta_2O_9$) ferroelectric film 4 having a film thickness 120 nm, an Ir upper electrode 5 having a film thickness 150 nm, and a TiN hard mask 6 having a film thickness 200 nm, as shown in FIG. 1. Herein, the adhesion film 2, the lower electrode 3, the upper electrode 5 and the hard mask 6 are formed by sputtering while the ferroelectric film 4 is formed by the application process using a spin coater. Meanwhile, a resist film 7 is formed on the hard mask 6, to form a resist pattern 7 as shown in FIG. 2 by a photolithography process.

Although the adhesion film 2 and lower electrode 3 herein was formed of TiN, an IrHf film may be further overlaid on the TiN film. Meanwhile, although the lower electrode 3 was formed of Ir, it maybe formed of IrO, Pt or the like or in a multi-layer structure further layering an IrO film and Pt film over the Ir film. The lower electrode 3 may be made in a structure having a Pt film overlaid on one or a plurality of films of selected from Ir, Ru, Rh Re and Os. Although the ferroelectric film 4 was formed of SBT, it may be formed of another ferroelectric material such as PZT (Pb ($Zr_xO_{1-x}$), SBTN (($SrBi_2$ (Ta, Nb$)_2O_9$) and BLT ((Bi, La)$_4Ti_3O_{12}$).

Figure 3:
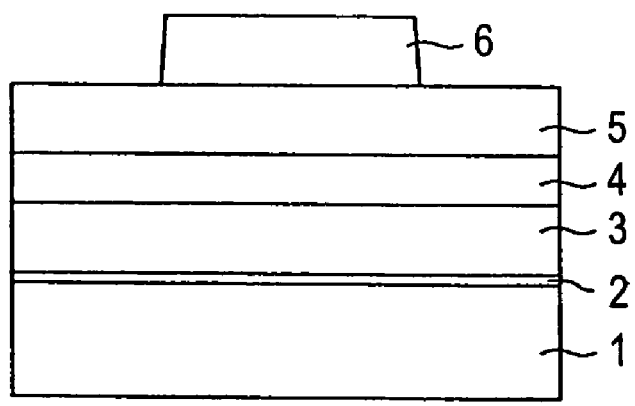
FIG. 3 is a sectional view explaining a method for manufacturing a ferroelectric element according to a first embodiment (3)

The resist pattern 7 is used as an etching mask, to form a hard mask 6 by a dry etch process as shown in FIG. 3. The dry etching is under the condition, for example, of a gas flow rate $Cl_2/BCl_3$ of 90/10 sccm, an RF power of 600 W, an etching pressure of 10 mTorr, and an etching time of 30 secs.

Figure 4:
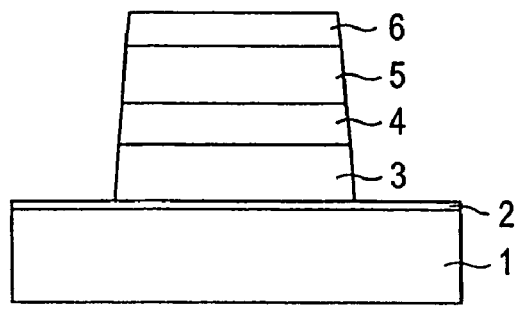
FIG. 4 is a sectional view explaining a method for manufacturing a ferroelectric element according to a first embodiment (4)

Furthermore, the hard mask 6 that is formed is used as an etching mask to form upper electrode 5, ferroelectric film 4 and lower electrode 3 by a dry etching process, as shown in FIG. 4. The dry etching is under the conditions of a gas flow rate $Cl_2/O_2$ of 10/10 sccm, an RF power of 800 W, an etching pressure of 5 mTorr and an etching time of 300 secs.

Figure 5:
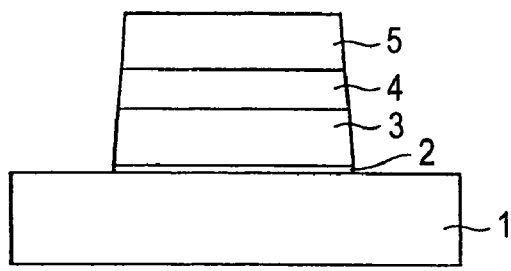
FIG. 5 is a sectional view explaining a method for manufacturing a ferroelectric element according to a first embodiment (5)

Then, as shown in FIG. 5, the hard mask 6 and exposed part of the adhesion film 2 are removed away by dry etching. The dry etching is under the condition, for example, of an etch gas flow rate $Cl_2/BCl_3$ of 70/30 sccm, an RF power of 800 W, an etching pressure of 5 mTorr and an etching time of 40 secs.

Figure 6:
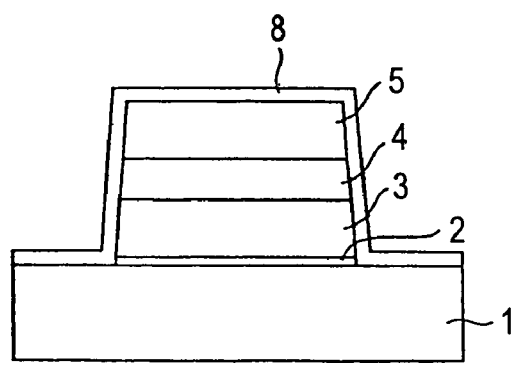
FIG. 6 is a sectional view explaining a method for manufacturing a ferroelectric element according to a first embodiment (6)
Figure 7:
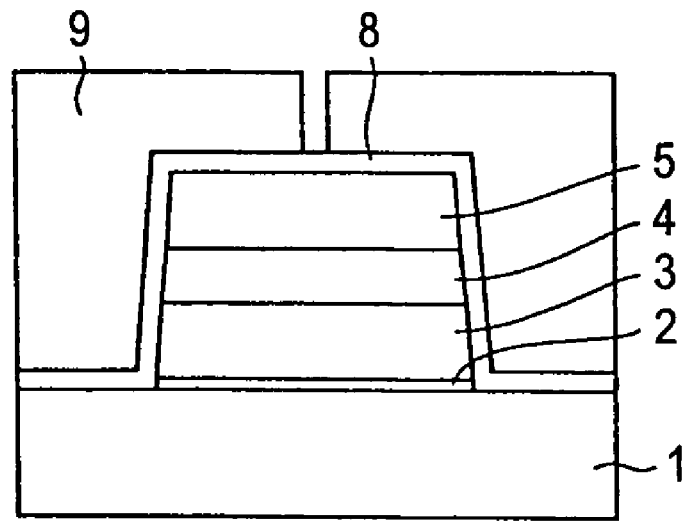
FIG. 7 is a sectional view explaining a method for manufacturing a ferroelectric element according to a first embodiment (7)
Figure 8:
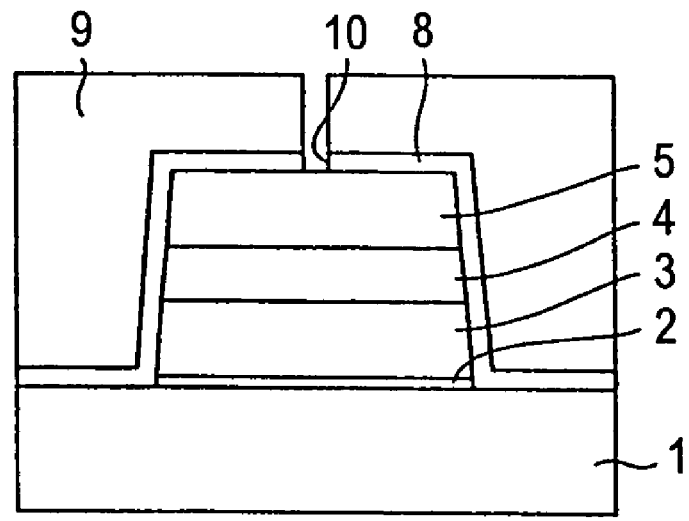
FIG. 8 is a sectional view explaining a method for manufacturing a ferroelectric element according to a first embodiment (8)

Thereafter, a hydrogen blocking film 8 of $Al_2O_3$ is formed in a film thickness of 50 nm over the entire surface by a CVD process, as shown in FIG. 6. Next, as shown in FIG. 7, resist is applied onto the hydrogen blocking film 8, and then by a photolithography process a resist pattern 9 having an 2-micrometer opening is formed. This resist pattern 9 is used as an etching mask, to form a 2-micrometer opening 10 in the hydrogen blocking film 8 thereby exposing a surface center of the upper electrode 5. Although the hydrogen blocking film 8 herein was formed of $Al_2O_3$, the hydrogen blocking film 8 is satisfactorily formed of a material preventing passage of hydrogen, i.e. may be formed of SrTaOx, AlN, $SrRuO_3$, ZrOx, RuOx, SrOx or the like.

The dry etching is under the condition, for example, of a gas flow rate $Cl_2/BCl_3$ of 50/50 sccm, an RF power of 800 W, an etching pressure of 5 mTorr and an etching time of 80 secs.

Figure 9:
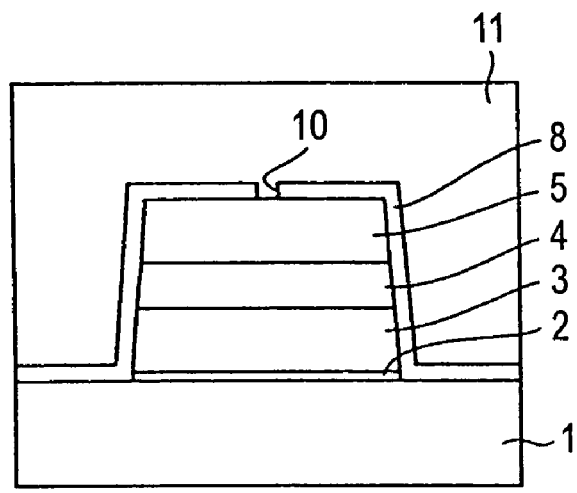
FIG. 9 is a sectional view explaining a method for manufacturing a ferroelectric element according to a first embodiment (9)

After removing the resist pattern 9 by ashing, an $SiO_2$ interlayer insulating film 11 is formed having a film thickness of 300 nm, as shown in FIG. 9.

Figure 10:
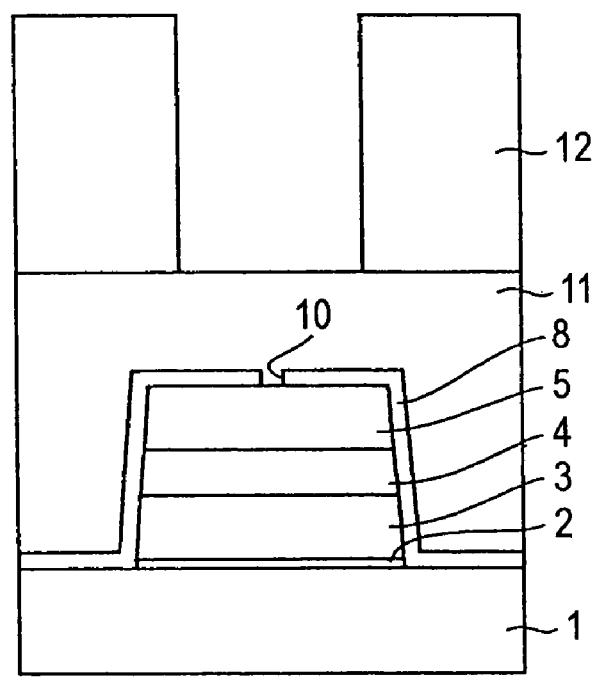
FIG. 10 is a sectional view explaining a method for manufacturing a ferroelectric element according to a first embodiment (10)
Figure 11:
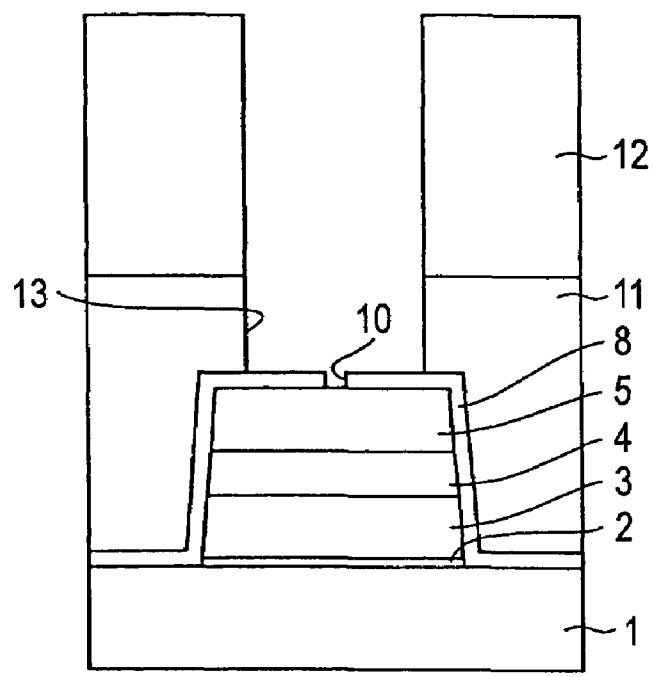
FIG. 11 is a sectional view explaining a method for manufacturing a ferroelectric element according to a first embodiment (11)

Then, a resist pattern 12 having an opening having a diameter 0.6 micrometer is formed on the interlayer insulation film 11 by a photolithography process, as shown in FIG. 10. This resist pattern 12 is used as an etching mask, to form an opening 13 having a diameter 0.6 micrometer by a dry etching process, as shown in FIG. 11.

The dry etching is under the condition, for example, of a gas flow rate $CHF_3$ of 100 sccm, an RF power of 600 W, an etching pressure of 5 mTorr, and an etching time of 60 secs. Under these etching conditions, almost no etching is done on the hydrogen blocking film 8 ($Al_2O_3$) because the selective ratio of $Al_2O_3$ to $SiO_2$ is 20 or higher.

Thereafter, the resist pattern 11 is removed by ashing, to form an aluminum interconnect film 14 connected to the upper electrode 5 through the openings 13 and 10, as shown in FIG. 12.

[Operational Effect]

In the ferroelectric capacitor made by the explained manufacturing method, instead of forming a constant opening diameter contact hole (openings 13 and 10) for connecting the aluminum interconnect film 14 to the upper electrode 5 in the hydrogen blocking film 8 and interlayer insulation film 11, the opening 10 in the hydrogen blocking film 8 is formed smaller in opening diameter (0.2 micrometer) than the diameter (0.6 micrometer) of the opening 13 in the interlayer insulating film 11. Due to this, reduced is the area of the hydrogen blocking film 8 formed directly on a surface of the upper electrode 5 which is removed, thereby reducing the surface area of upper electrode 5 not covered by the hydrogen blocking film 8. As a result, hydrogen is suppressed from entering at the opening 10 through the upper electrode 5, thereby preventing the deterioration in the ferroelectric film 4.

Meanwhile, with the hydrogen blocking film 8 smaller in film thickness (50 nm), even if the opening 10 is reduced in diameter (0.2 micrometer), the opening 10 will have an aspect ratio of 0.05/0.2=0.25. Thus, the aspect ratio of the opening 10 can be kept from being excessively increased. Meanwhile, in the opening 13 in the interlayer insulation film 11 greater in film thickness (300 nm), the diameter can be increased (0.6 micrometer) to provide an aspect ratio 0.3/0.6=0.5, thereby keeping the aspect ratio of the opening 13 from being excessively increased. Accordingly, the aluminum interconnect film 14 formed through the openings 13 and 10 can be suppressed from worsening in coverage, thus preventing the lowered reliability of the aluminum interconnect film 14.

Incidentally, in order not to worsen the coverage of the aluminum interconnect film 14, the aspect ratio is preferably 1 or smaller. Meanwhile, although the openings 10 and 13 have respective diameters of 0.2 and 0.6 micrometer, in case the opening 10 is smaller in opening diameter than the opening 13, it is possible to obtain an effect to prevent the deterioration in the ferroelectric film 4. Furthermore, in order not to worsen the coverage of the aluminum interconnect film 14, hydrogen blocking effect can be improved by making the opening 10 smaller in diameter to the extent that the opening 10 has an aspect ratio equal to or less than 1.

(2) Second Embodiment

FIGS. 13 to 17 are sectional views explaining a method for manufacturing a ferroelectric element according to a second embodiment of the invention.

[Structure]

Figure 17:
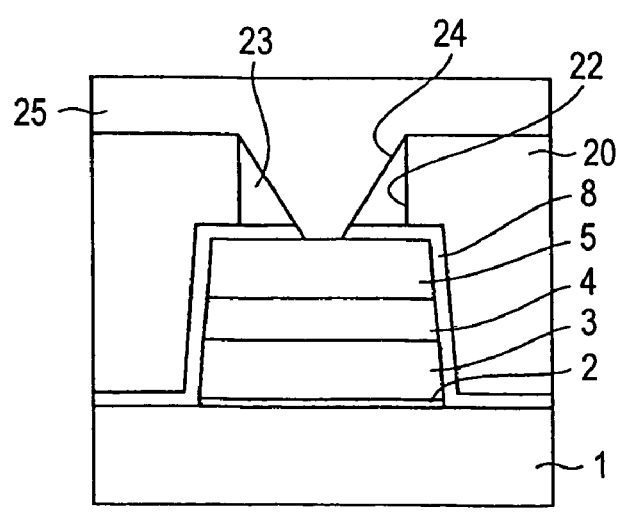
FIG. 17 is a sectional view explaining a method for manufacturing a ferroelectric element according to a second embodiment (17)

A ferroelectric capacitor of this embodiment has, as shown in FIG. 17, an oxide film 1 of $SiO_2$ on which are formed an adhesion film 2, a lower electrode 3 (first electrode), a ferroelectric film 4 and an upper electrode 5 (second electrode), in that order. A hydrogen blocking film 8 (first hydrogen blocking film) and interlayer insulation film 20 (second insulation film) is formed in a manner directly covering the adhesion film 2, the lower electrode 3, the ferroelectric film 4 and the upper electrode 5. The interlayer insulation film 20 is formed with an opening 22, while a hydrogen blocking film 23 (second hydrogen blocking film) is formed in the opening 22.

Meanwhile, the hydrogen blocking films 8 and 23 are formed with an opening 24 exposing a part of the upper electrode 5. An aluminum interconnect film 25 (interconnect film) is formed connected to the upper electrode through the opening 24.

The opening 24 has a diameter of 0.2 micrometer at its bottom exposing a part of the upper electrode 5 and a diameter of approximately 0.6 micrometer at the upper surface of the upper electrode 5 opposite from the upper electrode 5, i.e. formed to have an increasing diameter as distance from the upper electrode 5 increases.

[Manufacturing Method]

Now, a method for manufacturing a ferroelectric capacitor of this embodiment is explained with reference to FIGS. 13 to 17.

After completing the process of FIGS. 1 to 6 of the first embodiment, an interlayer insulation film 20 is formed of $SiO_2$ in a film thickness of 300 nm on the hydrogen blocking film 8 by a CVD (Chemical Vapor Deposition) process. Furthermore, a resist pattern 21 having an opening having a diameter 0.6 micrometer is formed above the upper electrode 5 by a photolithography process.

Figure 14:
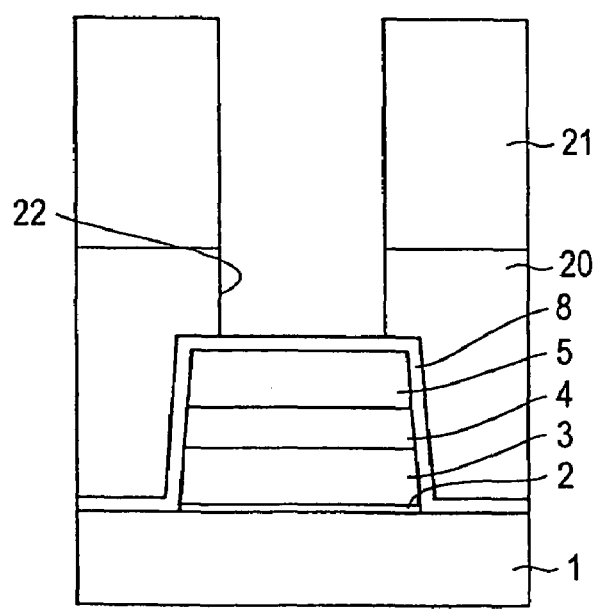
FIG. 14 is a sectional view explaining a method for manufacturing a ferroelectric element according to a second embodiment (14)

Next, as shown in FIG. 14, the resist pattern 21 is used as an etching mask, to form an opening 22 having a diameter 0.6 micrometer in the interlayer insulation film 20 by a dry etching process. The dry etching is under the condition, for example, of a gas flow rate $CHF_3$ of 100 sccm, an RF power of 100 W, an etching pressure of 5 mTorr, and an etching time of 60 secs.

Figure 15:
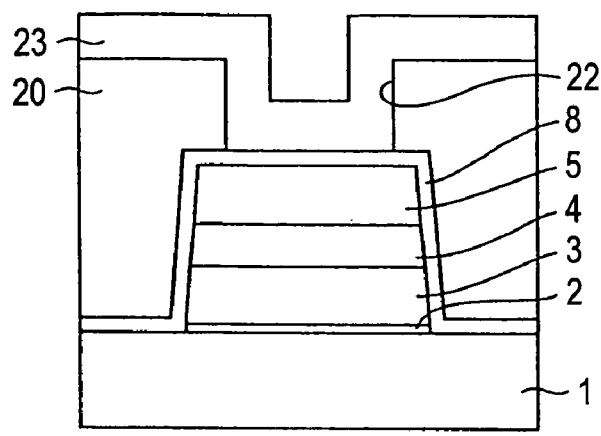
FIG. 15 is a sectional view explaining a method for manufacturing a ferroelectric element according to a second embodiment (15)

After removing the resist pattern 21 by ashing, a second hydrogen blocking film 23 of $Al_2O_3$ having a film thickness 200 nm is formed by a CVD process, as shown in FIG. 15. This hydrogen blocking film 23 is formed on a surface of the interlayer insulation film 20 and on an inner wall and bottom of the opening 22. At the bottom surface of the opening 22, this is formed in a manner connected with the hydrogen blocking film 8. The hydrogen blocking film 23 is desirably of the same material as the hydrogen blocking film 8. However, a material different from the hydrogen blocking film 8 may be used provided that it can be eched together with the hydrogen blocking film by one etching process. The hydrogen blocking film 23 is formed, for example, of $Al_2O_3$, $SrTaO_x$, AlN, $SrRuO_3$, $ZrO_x$, $RuO_x$, $SrO_x$ or the like.

Figure 16:
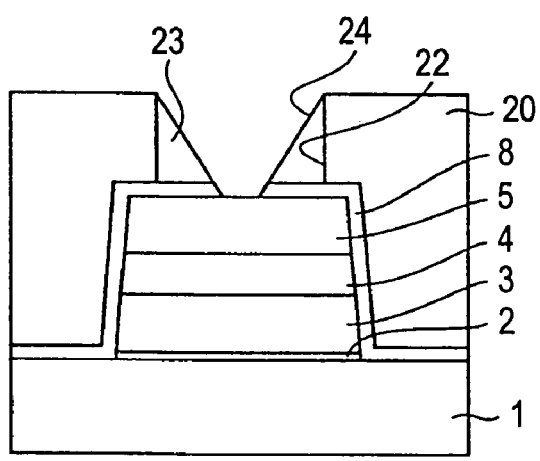
FIG. 16 is a sectional view explaining a method for manufacturing a ferroelectric element according to a second embodiment (16)

Next, the hydrogen blocking film 23 is etched back over the entire surface by a dry etching process, as shown in FIG. 16. In this etching back, the hydrogen blocking film 8 and 23 is etched at a surface center of the upper electrode 5, to expose the upper electrode 5 at its surface center and leave the hydrogen blocking film 23 on the inner wall of the opening 22, thus forming an opening 24 in the hydrogen blocking films 8 and 23. The opening 24 is formed to a diameter of 0.2 micrometer at its bottom exposing the upper electrode 5 and a diameter of 0.6 micrometer at the upper surface opposite from the upper electrode 5. The dry etching is under the condition, for example, of a gas flow rate $Cl_2/BCl_3$ of 50/50 sccm, an RF power of 800 W, an etching pressure of 5 mTorr, and an etching time of 240 secs.

Thereafter, an aluminum interconnect film 25 is formed connected to the upper electrode 5 through the opening 24, as shown in FIG. 17.

Thereafter, an aluminum interconnect film 25 is formed connected to the upper electrode 5 through the opening 24, as shown in FIG. 17.

Figures 18A, 18B:
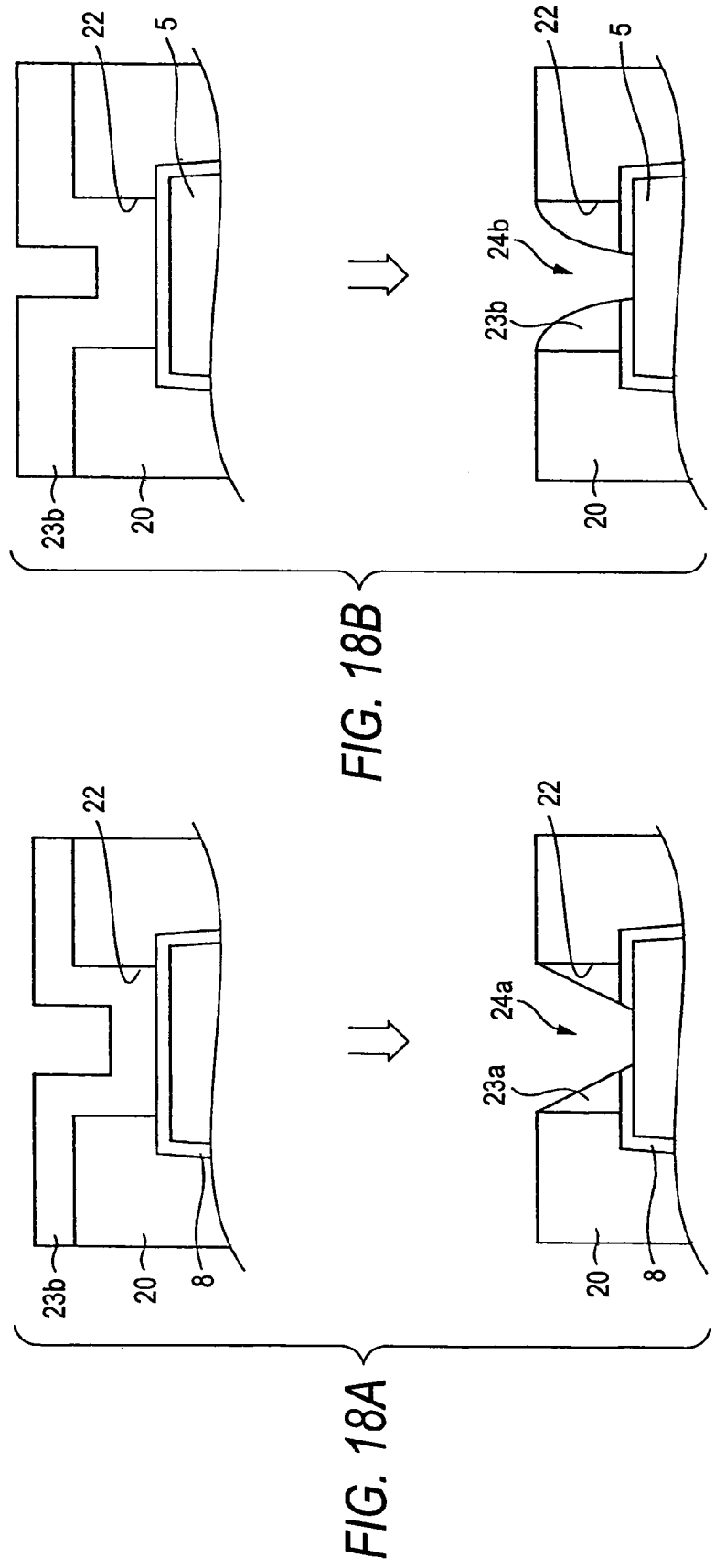
FIG. 18 is a sectional view explaining control of the diameter of the opening according to the second embodiment.

FIG. 18 is a figure explaining the relationship between film thickness of the hydrogen blocking layer 23 and the bottom diameter of the opening 24 exposing the upper electrode 23. Herein, a hydrogen blocking film 24b shown in FIG. 18B is greater in film thickness than the film thickness of a hydrogen blocking film 23a shown in FIG. 18A. As shown in FIGS. 18A and 18B, in the case of etching back the hydrogen blocking film 23b greater in film thickness, the thickness of the hydrogen blocking film 23b left on the inner wall of the opening 24b is greater than the thickness of the hydrogen blocking film 23a left on the inner wall of the opening 24a, and the diameter at the bottom of the opening 24b is smaller than the diameter at the bottom of the opening 24a. Accordingly, the bottom diameter of the opening 24 can be controlled by adjusting the film thickness of the hydrogen blocking film 23.

[Operational Effect]

In this embodiment, because the opening 24 is formed greater in diameter as its distance from the upper electrode 5 increases, it is possible to reduce the area of the upper electrode exposed by removing the hydrogen blocking films 8 and 23, similarly to the first embodiment. Thus, hydrogen is suppressed from entering at the opening 24 through the upper electrode 5. As a result, the ferroelectric film 4 can be improved in reliability.

Meanwhile, because the opening 24 is formed such that its diameter continuously increases as it extends from the upper electrode 5, an aluminum interconnect film can be formed more easily within the opening than the foregoing case of forming openings 10 and 13 different in diameter. Accordingly, the bottom diameter of the opening 24 can be made smaller than the diameter of the opening 10 of the first embodiment. Thus, hydrogen can be further prevented from entering at the opening 24.

In the first embodiment, in order to establish contact between the aluminum interconnect film and the upper electrode 15, the opening 10 in the hydrogen blocking film 8 and the opening 13 in the interlayer insulation film 8 were formed by the different processes, i.e. two photolithography and etching processes. However, this embodiment forms an opening 24 in a self-aligned fashion by etching back the hydrogen blocking film 23 over its entire surface, thereby omitting the two photolithography processes and reducing one etching process.

Meanwhile, because the opening 24 is formed in a self-aligned fashion by etching back, the bottom diameter of the opening 24 can be desirably reduced by adjusting the amount of etching.

Meanwhile, where a small opening is formed by a photolithography process, there is a fear to cause an alignment deviation of resist pattern. However, there is no fear to cause an alignment deviation because the opening 24 is formed in a self-aligned fashion.

Meanwhile, by adjusting the film thickness of the second hydrogen blocking film 23, the bottom diameter of the opening 24 can be controlled simply. Namely, it is easy to control the area of the hydrogen blocking film 8 that is removed on the surface of the upper electrode 5.

What is claimed is:

1. A ferroelectric element comprising:
   a first electrode;
   a ferroelectric film formed on the first electrode;
   a second electrode formed on the ferroelectric film;
   a first hydrogen blocking film formed directly on a surface of the second electrode;
   a first insulation film formed on the first hydrogen blocking film;
   a first opening formed in the first hydrogen blocking film and exposing a part of the second electrode;
   a second opening formed having a greater diameter than a diameter of the first opening, in the first insulation film; and
   an interconnect film connected to the second electrode through the first and second openings.

2. A ferroelectric element according to claim 1, wherein the first and second openings each have a diameter substantially constant with respect to the axial direction thereof.

3. A ferroelectric element according to claim 2, wherein the first and second openings are formed by different processes from each other.

4. A ferroelectric element according to claim 3, wherein the first opening is formed in the hydrogen blocking film prior to forming the first insulation film.

5. A ferroelectric element according to claim 2, wherein the first opening has an aspect ratio of 1 or smaller.

6. A ferroelectric element according to claim 1, wherein the first and second openings are formed to have a diameter increasing with distance from the second electrode.

7. A ferroelectric element according to claim 6, wherein the first and second openings are formed in one process.

8. A ferroelectric element according to claim 6, wherein the first insulation film has a second hydrogen blocking film formed at the second opening and a second insulation film formed around the second hydrogen blocking film.

9. A ferroelectric element according to claim 8, wherein the first and second openings are formed in a self-aligned fashion by etching back.

* * * * *